United States Patent
Shepard et al.

(10) Patent No.: US 9,589,913 B1
(45) Date of Patent: Mar. 7, 2017

(54) FLIP CHIP STACKING UTILIZING INTERPOSER

(71) Applicant: Rockwell Collins, Inc., Cedar Rapids, IA (US)

(72) Inventors: Sarah M. Shepard, Atkins, IA (US); Bret W. Simon, Cedar Rapids, IA (US); Alan P. Boone, Swisher, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 235 days.

(21) Appl. No.: 13/853,232

(22) Filed: Mar. 29, 2013

(51) Int. Cl.
| H01L 23/48 | (2006.01) |
| H01L 23/52 | (2006.01) |
| H01L 29/40 | (2006.01) |
| H01L 23/00 | (2006.01) |
| H01L 21/82 | (2006.01) |
| H05K 1/18 | (2006.01) |
| H01L 25/065 | (2006.01) |

(52) U.S. Cl.
CPC .............. *H01L 23/57* (2013.01); *H01L 21/82* (2013.01); *H05K 1/181* (2013.01); *H01L 25/0657* (2013.01); *H01L 2224/16225* (2013.01); *H01L 2224/32225* (2013.01); *H01L 2924/15311* (2013.01)

(58) Field of Classification Search
CPC . H01L 2224/32225; H01L 2224/16225; H01L 2224/15311; H01L 2224/73204; H01L 25/0657; H01L 24/97

USPC .................................................. 257/686, 774
See application file for complete search history.

(56) References Cited

U.S. PATENT DOCUMENTS

| 7,687,896 | B2 * | 3/2010 | Shibata .......................... 257/686 |
| 8,525,318 | B1 * | 9/2013 | Kim et al. .................... 257/686 |
| 2002/0003232 | A1 * | 1/2002 | Ahn ....................... G02B 6/4201 257/81 |
| 2008/0251913 | A1 * | 10/2008 | Inomata ................. H01L 21/563 257/737 |
| 2011/0101512 | A1 * | 5/2011 | Choi et al. ..................... 257/686 |
| 2013/0137216 | A1 * | 5/2013 | Ito et al. ....................... 438/108 |
| 2013/0162282 | A1 * | 6/2013 | Hatakeyama et al. ... 324/762.01 |
| 2014/0239508 | A1 * | 8/2014 | Ichikawa et al. .............. 257/774 |
| 2014/0312481 | A1 * | 10/2014 | Choi et al. .................... 257/686 |
| 2016/0254249 | A1 * | 9/2016 | Jeng ..................... H01L 25/0652 |

* cited by examiner

*Primary Examiner* — Zandra Smith
*Assistant Examiner* — John M Parker
(74) *Attorney, Agent, or Firm* — Angel N. Gerdzhikov; Donna P. Suchy; Daniel M. Barbieri

(57) ABSTRACT

An interposer and a method for stacking dies utilizing such an interposer in an integrated circuit are disclosed. The interposer includes a substrate and a plurality of vias defined in the substrate. At least one of the plurality of vias of the interposer is positioned to establish a connection with at least one of the plurality of vias of a first die. At least one additional die is positioned to establish a connection with the first die utilizing the connection established between the interposer and the first die through at least one of the vias.

14 Claims, 2 Drawing Sheets

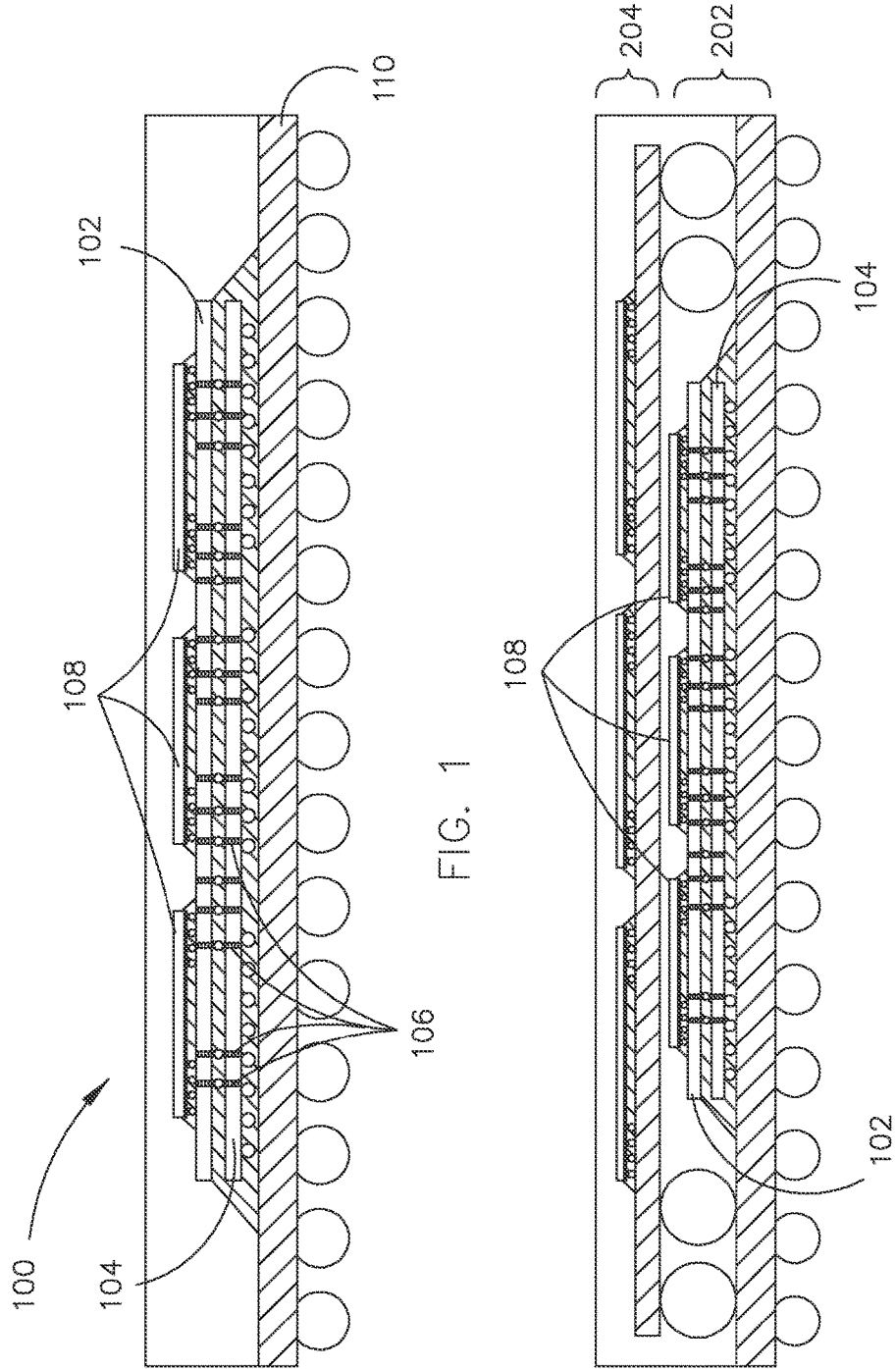

FLIP CHIP STACKING UTILIZING INTERPOSER

TECHNICAL FIELD

The present disclosure relates generally to packaging techniques for electronic circuitry, and more particularly to vertical stacking and interconnection techniques for electronic circuitry packaging.

BACKGROUND

Flip chip is a method for interconnecting semiconductor devices to external circuitry with solder bumps that have been deposited onto the chip pads. In order to mount the chip to external circuitry (e.g., a circuit board or another chip or wafer), the chip is flipped over and aligned so that its pads align with matching pads on the external circuit, and then the solder is flowed to complete the interconnect.

SUMMARY

The present disclosure is directed to an integrated circuit. The integrated circuit includes a flip chip die positioned on a circuit board, an interposer positioned on the flip chip die opposite to the circuit board, and at least one additional die positioned on the interposer opposite to the flip chip die. The interposer includes a plurality of vias, wherein at least one of the plurality of vias of the interposer is positioned to establish a connection with at least one of the plurality of vias of the flip chip die, and wherein the additional die is positioned to establish a connection with the flip chip die utilizing the connection established between the interposer and the flip chip die through at least one of the vias.

Another embodiment of the present disclosure is directed to a vertical stacking method for packaging an integrated circuit. The method includes: positioning a flip chip die on a circuit board, the flip chip die including a plurality of vias; positioning an interposer on the flip chip die opposite to the circuit board, the interposer including a plurality of vias, wherein at least one of the plurality of vias of the interposer is positioned to establish a connection with at least one of the plurality of vias of the flip chip die; and positioning at least one additional die on the interposer opposite to the flip chip die, wherein said at least one additional die is positioned to establish a connection with the flip chip die utilizing said at least one of the plurality of vias of the interposer communicatively connected with said at least one of the plurality of vias of the flip chip die.

A further embodiment of the present disclosure is directed to an interposer for stacking a first die and at least one additional die in an integrated circuit. The interposer includes a substrate and a plurality of vias defined in the substrate. At least one of the plurality of vias of the interposer is positioned to establish a connection with at least one of the plurality of vias of the first die, and the at least one additional die is positioned to establish a connection with the first die utilizing the connection established between the interposer and the first die through at least one of the vias.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figures in which:

FIG. 1 is a cross-sectional view depicting a vertically stacked die using an interposer in accordance with one embodiment of the present disclosure;

FIG. 2 is a cross-sectional view depicting a vertically stacked die using an interposer in accordance with another embodiment of the present disclosure.

DETAILED DESCRIPTION

Figure 3:
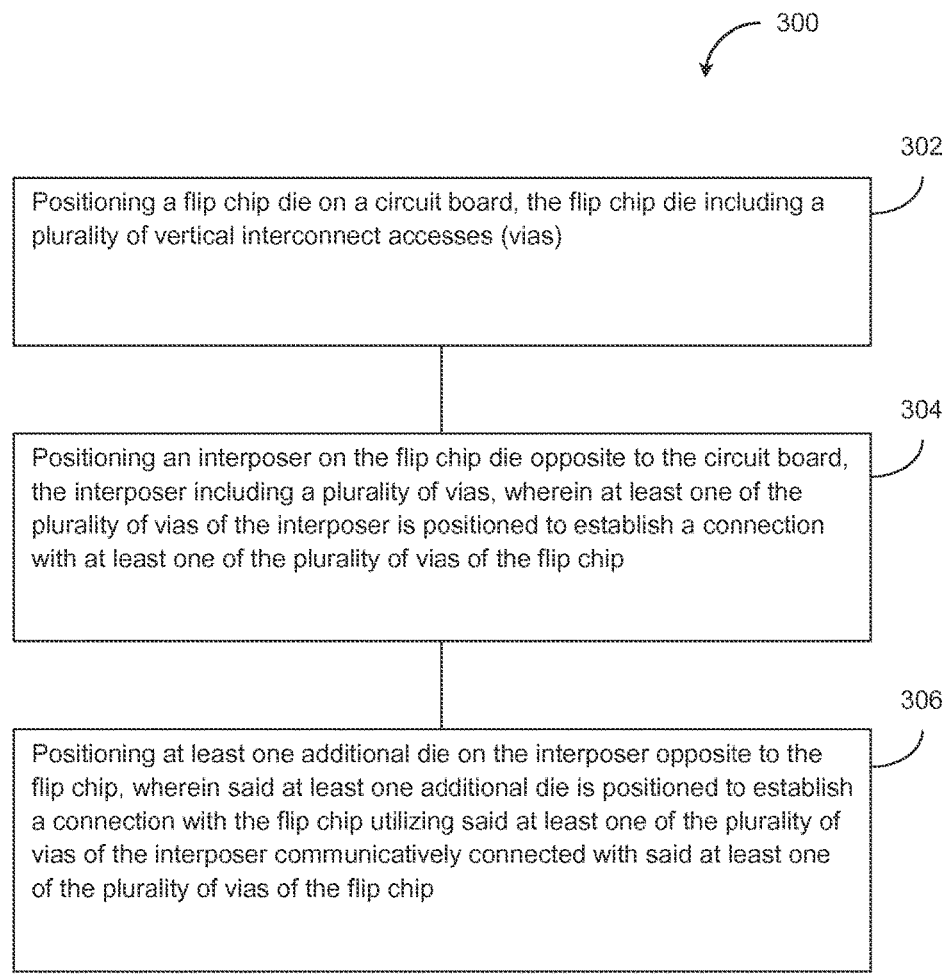
FIG. 3 is a flow diagram depicting a vertical stacking method for packaging an integrated circuit.

Reference will now be made in detail to exemplary embodiments of the disclosure, examples of which are illustrated in the accompanying drawings.

When creating an Application-Specific Integrated Circuit, or ASIC, there are common functionalities not available in the foundry process or are too expensive to implement internal to the ASIC. Such functionalities must then be included by placing extra die inside the package. However, die packaged in one package still need to communicate with one another through routing paths in the circuit board which are susceptible to probing attacks. Therein lies a need to attach the additional functionalities needed for the ASIC in a manner such that it is not susceptible to probing attacks.

The present disclosure provides vertical stacking and interconnection techniques utilizing vertical interconnect access (via or vias) in the non-active side of the ASIC and attach a double sided interposer to these vias using flip chip attachment methods. The interposer provided in accordance with the present disclosure allows additional die to be flip chip attached to the top of the interposer. Vertical stacking of the die eliminates the routing paths in the circuit board, therefore eliminating the susceptibility to probing attacks. Vertical stacking of the die also adds an additional layer of inherent anti-tamper protection. In addition, utilizing the interposer in accordance with the present disclosure makes the package cost effective if die footprints change or become obsolete. Furthermore, routing density is significantly increased utilizing the vertical stacking and interconnection techniques in accordance with the present disclosure.

Referring to FIG. 1, a cross-sectional view depicting vertically stacked die 100 in accordance with the present disclosure is shown. As illustrated in FIG. 1, a flip chip die 104 is positioned on a circuit board 110. An interposer 102 is attached to the flip chip die 104 on the side that is opposite to the circuit board 110. Vias 106 defined in both the interposer 102 and the die 104 establish connections between the interposer 102 and the die 104.

The flip chip die 104 may be a part of an ASIC that requires additional functionalities attached to it. The interposer 102 functions as a double sided router and allows additional dies 108 (e.g., flash memories or other components) to be attached to the top side (with respect to the orientation depicted in FIG. 1) of the interposer 102. This attachment technique eliminates substrate routing from one die to another, therefore increasing the difficulty for a probe attack and providing inherent anti-tamper protection. Signal integrity between die is also preserved by eliminating substrate routing typically used to connect die. This technique also provides a way to add functionalities to an ASIC which is not available or would have been too expensive to implement internal to the ASIC.

In one embodiment, the interposer 102 is an active double sided interposer with a silicon substrate and the vias 106 positioned in the interposer 102 are through-silicon vias (TSV's). However, it is contemplated that the substrate of the interposer 102 may be made of other types of materials such as glass, ceramic or the like. It is also contemplated that the vias 106 are not limited to through-silicon vias. Other types of vias may also be utilized without departing from the spirit and scope of the present disclosure.

The stacking configuration enabled by the interposer 102 in accordance with the present disclosure provides enhancements by increasing package density through direct attach methods utilizing vias 106 in both the ASIC and interposer. The package can be easily customized for different applications as the additional die are directly attached to the interposer 102. In addition, by bringing signals from the ASIC to the top of the die, the flip chip I/O can be reduced. Furthermore, by reducing flip chip I/O it is possible to achieve a cheaper laminate substrate and increase board yield.

While the vertically stacked die 100 depicted in FIG. 1 shows the ASIC 104 with TSV's on the non-active side, double sided silicon interposer 102 in the middle and additional dies 108 attached to the top of the interposer 102, it is contemplated that such a configuration is merely exemplary. More than one interposer 102 may be utilized to allow additional layers to be stacked on top of each other. For instance, an additional interposer with TSV's may be positioned on top of die 108, allowing another layer of additional die to be vertically stacked on top of said additional interposer. It is contemplated that the number of interposers utilized to facilitate such vertical stacking is not limited and may vary as long as the overall thickness of the stacked chip still satisfies a given design requirement.

It is further contemplated that the vertical stacking technique utilizing an interposer in accordance with the present disclosure may be used in conjunction with a stacked package. Referring to FIG. 2, a package-on-package (PoP) packaging method that combines vertically discrete logic and memory ball grid array packages is depicted. Two or more packages 202 and 204 are installed atop each other with a standard interface to route signals between them. It is contemplated that in cases where the flip chip (ASIC) die 104 in the lower package requires additional functionalities attached to it, the interposer 102 as described above may be positioned on top of the flip chip (ASIC) die 104 to allow additional die 108 to be attached to the top side of the interposer 102. Adding the stacked die using the interposer 102 allows the package functionality to be increased without increasing the overall package size. It is contemplated that this packaging technique will benefit many current and new programs requiring miniaturized electronics in various fields and applications.

FIG. 3 is a flow diagram illustrating the operation of a vertical stacking method 300 for packaging an integrated circuit. Step 302 may first position a die (e.g., a flip chip die) on a circuit board. Step 304 may then position an interposer on the flip chip die on the side that is opposite to the circuit board. As previously described, the interposer may include a plurality of vias, and at least one of the plurality of vias of the interposer may be positioned to establish a connection with at least one of the plurality of vias of the flip chip. Step 306 may subsequently position one or more additional die on top of the interposer, wherein the additional die is positioned to establish a connection with the flip chip die utilizing the connection established through the vias, as described above.

It is contemplated that while flip chip techniques are referenced in the descriptions above, such techniques are merely exemplary. For instance, the die 104 depicted in FIG. 1 may be connected to the circuit board 110 utilizing various other types of interconnection techniques and/or mechanisms. It is understood that the methods and systems in accordance of the present disclosure are applicable to various other types of interconnection techniques and/or mechanisms without departing from the spirit and scope of the present disclosure.

It is understood that the present disclosure is not limited to any underlying implementing technology. The present disclosure may be implemented utilizing any combination of software and hardware technology. The present disclosure may be implemented using a variety of technologies without departing from the scope and spirit of the disclosure or without sacrificing all of its material advantages.

It is understood that the specific order or hierarchy of steps in the processes disclosed is an example of exemplary approaches. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

It is believed that the present disclosure and many of its attendant advantages will be understood by the foregoing description, and it will be apparent that various changes may be made in the form, construction, and arrangement of the components thereof without departing from the scope and spirit of the disclosure or without sacrificing all of its material advantages. The form herein before described being merely an explanatory embodiment thereof, it is the intention of the following claims to encompass and include such changes.

What is claimed is:

1. An integrated circuit, comprising:
    a flip chip die positioned on a circuit board, the flip chip die including a plurality of vertical interconnect accesses (vias), the flip chip die having an active side and a non-active side opposite to the active side, the active side of the flip chip die being oriented to face the circuit board;
    an interposer positioned on the flip chip die opposite to the circuit board, the interposer including a plurality of vias, wherein at least one of the plurality of vias of the interposer is positioned to establish a connection with at least one of the plurality of vias of the flip chip die; and
    a plurality of additional dies positioned directly on the interposer opposite to the flip chip die, wherein each of said plurality of additional dies is positioned to establish a connection with the same flip chip die utilizing said at least one of the plurality of vias of the interposer communicatively connected with said at least one of the plurality of vias of the flip chip die, and wherein the interposer is configured to provide routing between said plurality of additional dies and the same flip chip die to preserve signal integrity between said plurality of additional dies and the flip chip die.

2. The integrated circuit of claim 1, wherein the interposer is a silicon interposer.

3. The integrated circuit of claim 1, wherein each of the plurality of vias of the interposer is a through-silicon via (TSV).

4. The integrated circuit of claim 1, wherein each of the plurality of vias of the flip chip die is a through-silicon via (TSV).

5. The integrated circuit of claim 1, wherein the flip chip die is an Application-Specific Integrated Circuit (ASIC) and said plurality of additional dies provides functionalities external to the ASIC through vertical stacking.

6. The integrated circuit of claim 1, wherein the flip chip die positioned on the circuit board, the interposer positioned on the flip chip die and said plurality of additional dies positioned on the interposer jointly form a first package, wherein the integrated circuit further comprises a second package physically and logically discrete from the first package, and wherein the second package is stacked on the first package in a package-on-package manner to position the first package within an opening defined between the second package and the circuit board.

7. An interposer for stacking a first die and a plurality of additional dies in an integrated circuit, the interposer comprising:
   a substrate; and
   a plurality of vertical interconnect accesses (vias) defined in the substrate;
   wherein the plurality of vias of the interposer is positioned to establish connections with a plurality of vias of the first die, wherein said plurality of additional dies is positioned to establish connections with the same first die utilizing said the plurality of vias of the interposer communicatively connected with said the plurality of vias of the first die, and wherein the interposer is configured to provide routing between said plurality of additional dies and the same first die to preserve signal integrity between said plurality of additional dies and the first die.

8. The interposer of claim 7, wherein the interposer is a silicon interposer.

9. The interposer of claim 7, wherein each of the plurality of vias of the interposer is a through-silicon via (TSV).

10. The interposer of claim 7, wherein the first die is positioned on a circuit board, the first die having an active side and a non-active side opposite to the active side, the active side of the first die being oriented to face the circuit board.

11. The interposer of claim 10, wherein the interposer is positioned on the first die opposite to the circuit board.

12. The interposer of claim 11, wherein said plurality of additional dies is positioned directly on the interposer opposite to the first die.

13. The interposer of claim 11, wherein the first die positioned on the circuit board, the interposer positioned on the first die and said plurality of additional dies positioned on the interposer jointly form a first package, wherein the integrated circuit further comprises a second package physically and logically discrete from the first package, and wherein the second package is stacked on the first package in a package-on-package manner to position the first package within an opening defined between the second package and the circuit board.

14. The interposer of claim 7, wherein the first die is an Application-Specific Integrated Circuit (ASIC) and said plurality of additional dies provides functionalities external to the ASIC through vertical stacking.

* * * * *